United States Patent
Wang et al.

(10) Patent No.: US 10,840,085 B2
(45) Date of Patent: Nov. 17, 2020

(54) METHOD FOR IMPROVING BONDING OF DANGLING BONDS OF SILICON ATOMS

(71) Applicant: Wuhan Xinxin Semiconductor Manufacturing Co., Ltd., Wuhan (CN)

(72) Inventors: Xilong Wang, Wuhan (CN); Sheng Hu, Wuhan (CN); Wen Zou, Wuhan (CN)

(73) Assignee: Wuhan Xinxin Semiconductor Manufacturing Co., Ltd., Wuhan (CN)

( * ) Notice: Subject to any disclaimer, the term of this patent is extended or adjusted under 35 U.S.C. 154(b) by 1 day.

(21) Appl. No.: 16/351,407

(22) Filed: Mar. 12, 2019

(65) Prior Publication Data
US 2019/0333762 A1 Oct. 31, 2019

(30) Foreign Application Priority Data
Apr. 25, 2018 (CN) .......................... 2018 1 0381048

(51) Int. Cl.
*H01L 21/02* (2006.01)
*H01L 21/324* (2006.01)

(52) U.S. Cl.
CPC .... *H01L 21/02238* (2013.01); *H01L 21/0228* (2013.01); *H01L 21/02164* (2013.01); *H01L 21/02183* (2013.01); *H01L 21/324* (2013.01)

(58) Field of Classification Search
None
See application file for complete search history.

(56) References Cited

U.S. PATENT DOCUMENTS

| | | | |
|---|---|---|---|
| 8,987,096 B2* | 3/2015 | Chen | H01L 29/66477 257/E21.409 |
| 2008/0171427 A1* | 7/2008 | Lojek | H01L 27/11521 438/585 |
| 2016/0118515 A1* | 4/2016 | Mori | H01L 31/022441 136/256 |
| 2017/0345643 A1* | 11/2017 | Younkin | G03F 7/094 |
| 2018/0005870 A1* | 1/2018 | Hsu | H01L 29/0649 |

* cited by examiner

*Primary Examiner* — Mounir S Amer
(74) *Attorney, Agent, or Firm* — Winston Hsu

(57) ABSTRACT

The invention discloses a method for improving bonding of dangling bonds of silicon atoms. A surface of a wafer is oxidized to form a silicon oxide layer. The upper surface of the silicon oxide layer has a dangling bond. A dielectric layer is disposed on the upper surface of the silicon oxide layer, which is then subjected to an oxygen-enriched oxidation treatment at a preset first temperature. A protective layer is disposed on the upper surface of the dielectric layer. The wafer is then subjected to an annealing treatment. By passing oxidizing gas through the surface of the protective layer, oxygen ions in the oxidizing gas penetrate the dielectric layer to reach wafer surface. After high-temperature annealing treatment, the unsaturated bonds of the silicon atoms are bonded to the oxygen ions on the wafer surface, thereby improving the bonding of the dangling bonds on the wafer surface.

10 Claims, 2 Drawing Sheets

METHOD FOR IMPROVING BONDING OF DANGLING BONDS OF SILICON ATOMS

BACKGROUND OF THE INVENTION

1. Field of the Invention

The present disclosure relates generally to the field of semiconductor technology. More particularly, the present disclosure relates to a method for improving bonding of dangling bonds of silicon atoms.

2. Description of the Prior Art

Since the debut of solid-state imaging devices invented by Bell Labs in late 1960s, solid-state image sensors have been developed rapidly and become an important branch of sensing technology. The solid-state imaging device is an indispensable peripheral device for personal computer and multimedia as well as a core device in monitoring equipment.

In recent years, due to the improvement of integrated circuit design and fabrication process, CMOS image sensors (CIS) are widely used, which include the features of in-pixel amplification, column parallel structure, high integration, single-supply and low-voltage power supply, low cost and low technical barriers. At the same time, the advantages such as low-cost, single-chip, low-power consumption and simple design make CIS a leader in the field of low-end pixel products such as security surveillance systems, video phones, camera phones, toys, automobiles and medical electronics.

A CMOS image sensor is a typical solid-state imaging sensor. CMOS image sensors usually consist of an array of image sensitive cells, row drivers, column drivers, timing control logic, AD converters, data bus output interfaces, control interfaces, etc. These parts are usually integrated on the same silicon. The working process can be generally divided into reset, photoelectric conversion, integration, and reading.

The number of white pixels (WP) on the CIS wafer refers to the number of pixels with a DN (Digital Number, DN) value greater than 64 in the absence of illumination. It is an important indicator for evaluating the performance of CIS devices and it directly reflects the device imaging quality. Therefore, improving the WP performance of CIS device, that is, reducing the number of white pixels, is important for the CIS device manufacturing process.

The dangling bond is a chemical bond. Generally, the crystal lattice terminates at the surface and each atom in the outermost layer of the surface may have an unpaired electron, that is, an unsaturated bond, which is known as a dangling bond.

During the fabrication of the CIS device, silicon atoms are bonded to oxygen atoms at the silicon interface below the high-k dielectric layer to form a silicon dioxide layer. However, in the existing CIS process, the lack of the source to bond with the dangling bonds of the silicon atoms at the silicon interface results in a lower degree of bonding of the dangling bonds at the silicon interface, which leads to increased white pixels of the device and reduced performance of the CIS devices.

SUMMARY OF THE INVENTION

The present invention addresses the above-mentioned prior art deficiencies and proposes a method for improving bonding of dangling bonds of silicon atoms. By treating the surface of the protective layer with an oxidizing gas, oxygen ions in the oxidizing gas penetrate the dielectric layer to reach the wafer surface. After the high-temperature annealing treatment, the unsaturated bonds of silicon atoms are bonded to the oxygen ions on the wafer surface, thereby improving the bonding of the dangling bonds of the silicon atom on the wafer surface.

The invention is achieved by the following technical solutions.

The present invention relates to a method of improving bonding of dangling bonds of silicon atoms, comprising the steps of:

Step S1: the surface of a wafer is oxidized to form a silicon oxide layer, wherein the upper surface of the silicon oxide layer has a dangling bond;

Step S2: a dielectric layer is disposed on the upper surface of the silicon oxide layer;

Step S3: an oxygen-enriched oxidation treatment is performed on the surface of the dielectric layer at a preset first temperature;

Step S4: a protective layer is disposed on the upper surface of the dielectric layer; and Step S5: the wafer is subjected to an annealing treatment.

Preferably, the annealing treatment is carried out at a temperature ranging between 250° C. and 1400° C.

According to a preferred embodiment, the dielectric layer is a high-k dielectric layer.

According to a preferred embodiment, the high-k dielectric layer is tantalum pentoxide.

According to a preferred embodiment, the protective layer is silicon dioxide.

According to a preferred embodiment, the preset first temperature ranges between 25° C. and 1400° C.

According to a preferred embodiment, in Step S3, the oxygen-enriched oxidation treatment comprises passing oxygen to the surface of the dielectric layer.

According to a preferred embodiment, in Step S3, the oxygen-enriched oxidation treatment comprises passing ozone to the surface of the dielectric layer.

According to a preferred embodiment, in Step S3, the oxygen-enriched oxidation treatment comprises ashing the surface of the dielectric layer.

According to a preferred embodiment, the protective layer is deposited on the upper surface of the dielectric layer by using a chemical vapor deposition process.

The beneficial effects of the above technical solutions are:

According to the invention, an oxidizing gas is passed through the surface of the protective layer, and oxygen ions in the oxidizing gas penetrate the dielectric layer to reach the surface of the wafer, and after high-temperature annealing treatment, the unsaturated bonds of silicon atoms are bonded to the oxygen ion on the wafer surface, thereby the bonding of the dangling bonds of the silicon atoms on the wafer surface is improved.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

DETAILED DESCRIPTION

Figure 1:
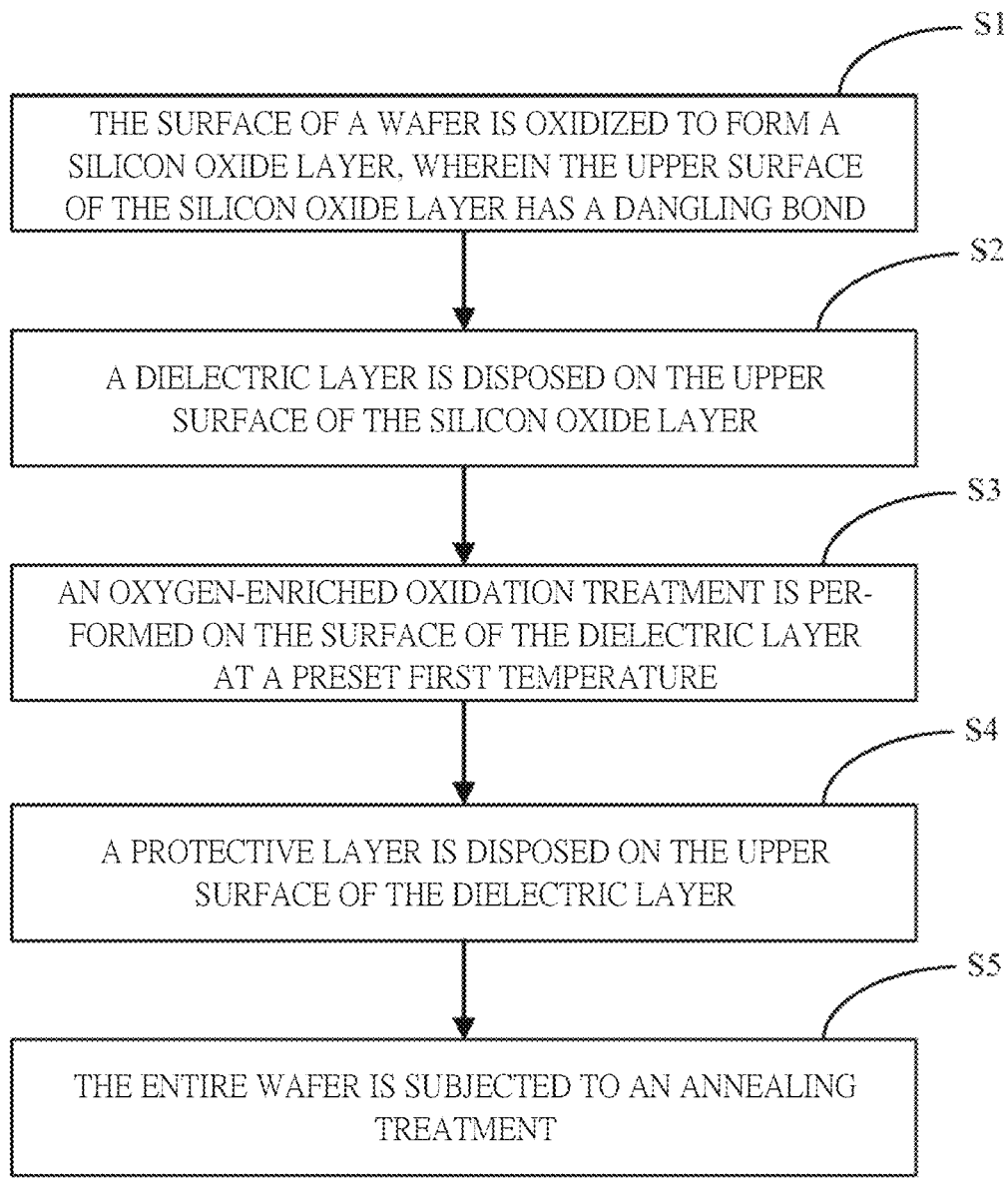
FIG. 1 is a flow chart of a method for improving bonding of dangling bonds of silicon atoms according to one preferred embodiment of the present invention.

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The technical solutions in the embodiments of the present invention are clearly and completely described in the following with reference to the accompanying drawings in the embodiments of the present invention. It is obvious that the described embodiments are only a part of the embodiments of the present invention, but not all embodiments. All other embodiments obtained by a person of ordinary skill in the art based on the embodiments of the present invention without creative efforts are within the scope of the present invention.

It should be noted that the embodiments in the present invention and the features in the embodiments may be combined with each other without conflict.

The invention is further illustrated by the following figures and specific embodiments. However, these figures and specific embodiments should not be construed as limiting.

The present embodiment pertains to a method for improving bonding of dangling bonds of silicon atoms. By passing an oxidizing gas on the surface of the protective layer, oxygen ions in the oxidizing gas penetrate the dielectric layer to reach the wafer surface. After high-temperature annealing treatment, the unsaturated bonds of the silicon atoms on the surface of the wafer surface are bonded to the oxygen ions 6, thereby improving the bonding of the dangling bond 5 of the silicon atoms on the wafer surface.

Figure 2:
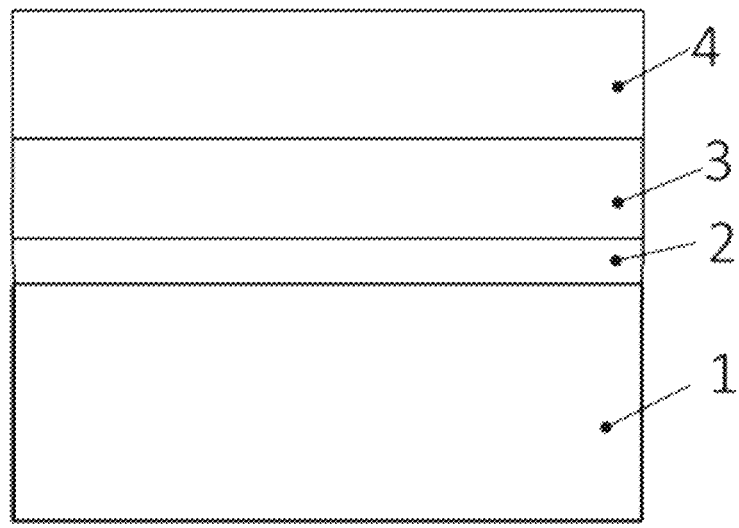
FIG. 2 is a schematic view showing the structure of a wafer after depositing a protective layer according to one preferred embodiment of the present invention.
Figure 3:
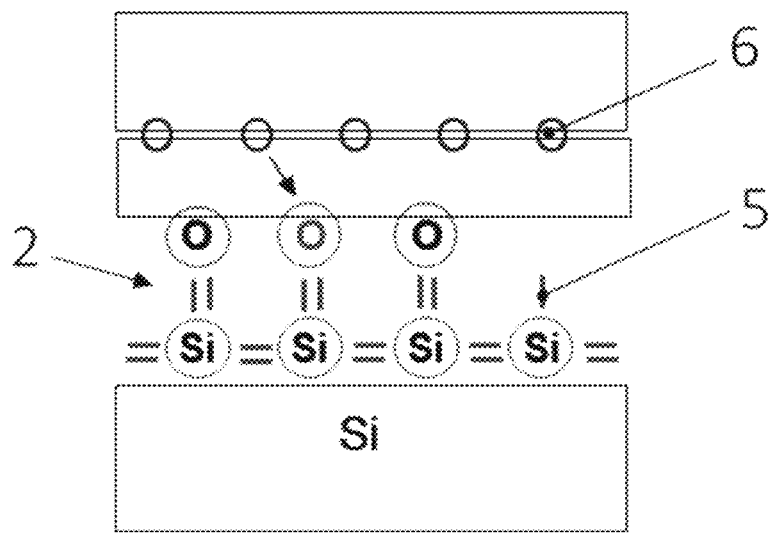
FIG. 3 is a schematic view showing bonded dangling bonds according to one preferred embodiment of the present invention Embodiments of the present disclosure will be described with reference to the accompanying drawings.

Referring to FIG. 1 to FIG. 3, the method for increasing the bonding of dangling bonds 5 of the silicon atoms in this embodiment comprises the following steps:

In Step S1, the surface of a wafer 1 is oxidized to forma silicon oxide layer 2, wherein the upper surface of the silicon oxide layer 2 has a dangling bond 5 (FIG. 3);

In Step S2, a dielectric layer 3 is disposed on the upper surface of the silicon oxide layer 2;

In Step S3, an oxygen-enriched oxidation treatment is performed on the surface of the dielectric layer 3 at a preset first temperature;

In Step S4, a protective layer 4 is disposed on the upper surface of the dielectric layer 3; and In Step S5, the entire wafer 1 is subjected to an annealing treatment.

In the gate fabrication process of the MOS transistor in a CMOS image sensor (CIS), a thin silicon oxide layer 2 is first disposed on the surface of the wafer 1. The silicon oxide layer 2 can be obtained by oxidation or by deposition on the surface of the wafer using a chemical vapor deposition process.

Subsequently, the dielectric layer 3 is deposited on the upper surface of the silicon oxide layer 2 by a chemical vapor deposition process.

As shown in FIG. 2, a protective layer 4 is disposed on the surface of the dielectric layer 3 for protecting the underlying dielectric layer 3 during a subsequent annealing process. The protective layer 4 may be deposited on the upper surface of the dielectric layer 3 by using a chemical vapor deposition process.

According to one embodiment, the annealing treatment is carried out at a temperature ranging between 250° C. and 1400° C.

According to one embodiment, the dielectric layer 3 is a high-dielectric-constant (high-k) dielectric layer 3.

In a preferred embodiment, the high-k dielectric layer 3 is tantalum pentoxide ($Ta_2O_5$).

In a preferred embodiment, the protective layer 4 is silicon dioxide ($SiO_2$).

In a preferred embodiment, the preset first temperature ranges between 25° C. and 1400° C.

In a preferred embodiment, in Step S3, the oxygen-enriched oxidation treatment comprises passing oxygen to the surface of the dielectric layer 3.

In a preferred embodiment, in Step S3, the oxygen-enriched oxidation treatment comprises passing ozone to the surface of the dielectric layer 3.

In a preferred embodiment, in Step S3, the oxygen-enriched oxidation treatment comprises ashing the surface of the dielectric layer 3.

The term "ashing" refers to the process of treating the surface of the object or substrate by oxygen ($O_2$) or ozone ($O_3$) plasma.

As shown in FIG. 3, at the preset first temperature, during the oxygen-enriched oxidation treatment of the surface of the dielectric layer 3, free oxygen ions 6 are generated on the surface of the dielectric layer 3. During the annealing process, the adsorbed oxygen ions 6 are accelerated to diffuse into the silicon oxide layer 2 and are bonded to the dangling bonds 5 of the silicon atoms, thereby improving bonding of the dangling bonds 5 of the silicon atoms of the silicon oxide layer 2.

After the CIS wafer 1 is processed by the method of the present invention, the number of white pixels in the CIS is reduced by 15 to 20% compared to the prior art.

In comparison to the prior art, the method for improving bonding of the dangling bonds of silicon atoms of the present invention has the following features.

According to the invention, an oxidizing gas is passed through the surface of the protective layer, and oxygen ions in the oxidizing gas penetrate the dielectric layer to reach the surface of the wafer, and after high-temperature annealing treatment, the unsaturated bonds of the silicon atoms are bonded to the oxygen ions on the wafer surface, thereby improving the bonding of the dangling bonds of silicon atoms on the wafer surface.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for improving bonding of dangling bonds of silicon atoms, comprising:
    oxidizing a surface of a wafer to form a silicon oxide layer, wherein an upper surface of the silicon oxide layer has a dangling bond;
    disposing a dielectric layer on the upper surface of the silicon oxide layer;
    performing an oxygen-enriched oxidation treatment on a surface of the dielectric layer at a preset first temperature to generate free oxygen ions on the surface of the dielectric layer;
    disposing a protective layer on the upper surface of the dielectric layer; and
    subjecting the wafer to an annealing treatment to diffuse the free oxygen ions into the silicon oxide layer through the dielectric layer.

2. The method according to claim 1, wherein the annealing treatment is carried out at a temperature ranging between 250° C. and 1400° C.

3. The method according to claim 1, wherein the dielectric layer is a high-k dielectric layer.

4. The method according to claim 3, wherein the high-k dielectric layer is tantalum pentoxide.

5. The method according to claim 1, wherein the protective layer is silicon dioxide.

6. The method according to claim 1, wherein the preset first temperature ranges between 25° C. and 1400° C.

7. The method according to claim 1, wherein the oxygen-enriched oxidation treatment comprises passing oxygen to the surface of the dielectric layer.

8. The method according to claim 1, wherein the oxygen-enriched oxidation treatment comprises passing ozone to the surface of the dielectric layer.

9. The method according to claim 1, wherein the oxygen-enriched oxidation treatment comprises ashing the surface of the dielectric layer.

10. The method according to claim 1, wherein the protective layer is deposited on the upper surface of the dielectric layer by using a chemical vapor deposition process.

* * * * *